(12) United States Patent
Hartner et al.

(10) Patent No.: US 6,809,019 B2
(45) Date of Patent: Oct. 26, 2004

(54) METHOD FOR PRODUCING A SEMICONDUCTOR STRUCTURE, AND USE OF THE METHOD

(75) Inventors: Walter Hartner, Glen Allen, VA (US); Matthias Krönke, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/261,849

(22) Filed: Sep. 30, 2002

(65) Prior Publication Data

US 2003/0064561 A1 Apr. 3, 2003

(30) Foreign Application Priority Data

Sep. 28, 2001 (DE) .......................................... 101 47 929

(51) Int. Cl.[7] .......................................... H01L 21/3205
(52) U.S. Cl. ...................... 438/593; 438/596; 438/597; 216/69; 216/70
(58) Field of Search ................................ 438/692, 701, 438/705, 712, 720, 652–656, 240, 253, 593–596

(56) References Cited

U.S. PATENT DOCUMENTS

| | | | |
|---|---|---|---|
| 5,335,138 A | | 8/1994 | Sandhu et al. |
| 5,792,593 A | | 8/1998 | McClure et al. |
| 5,885,900 A | | 3/1999 | Schwartz |
| 5,998,250 A | | 12/1999 | Andricacos et al. |
| 6,037,206 A | * | 3/2000 | Huang et al. ............... 438/240 |
| 6,210,595 B1 | * | 4/2001 | Weinrich et al. ............... 216/70 |
| 2002/0019138 A1 | | 2/2002 | Beitel et al. |

FOREIGN PATENT DOCUMENTS

| | | |
|---|---|---|
| DE | 100 22 656 A1 | 11/2001 |
| EP | 0 901 157 A2 | 3/1999 |

\* cited by examiner

*Primary Examiner*—Dung A. Le
(74) *Attorney, Agent, or Firm*—Laurence A. Greenberg; Werner A. Stemer; Ralph E. Locher

(57) ABSTRACT

A method for producing a semiconductor structure includes applying at least one first layer, etching the first layer using a masking layer such that fences are produced, and, after removal of the masking layer and application of an auxiliary layer, the auxiliary layer and the fences are removed jointly except for a predetermined extent of the auxiliary layer. The present invention also relates to use of the method for producing spacers in a semiconductor structure.

12 Claims, 3 Drawing Sheets

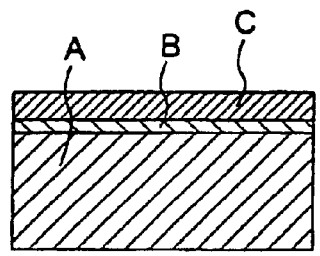
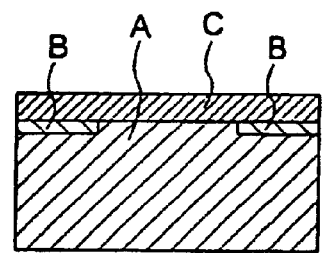
FIG. 2d    FIG. 3d
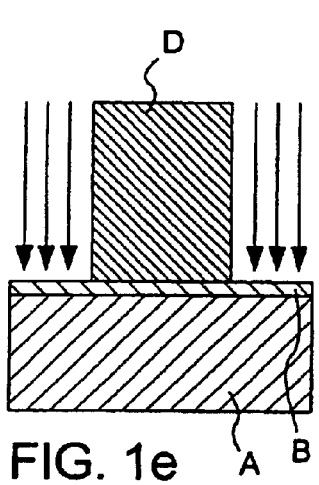
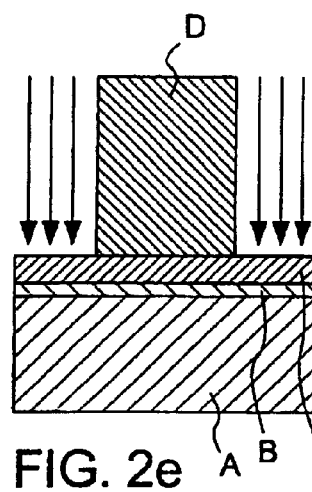
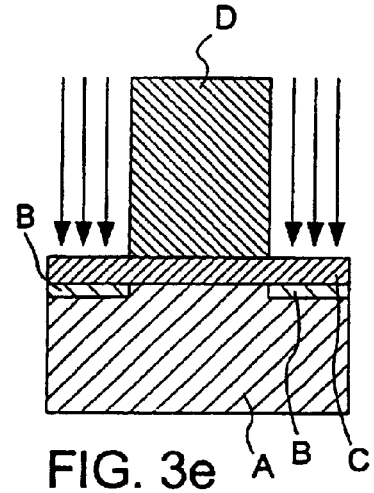
FIG. 1e    FIG. 2e    FIG. 3e
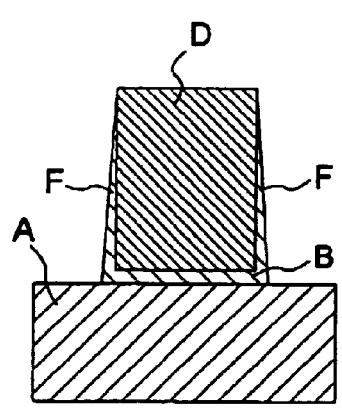
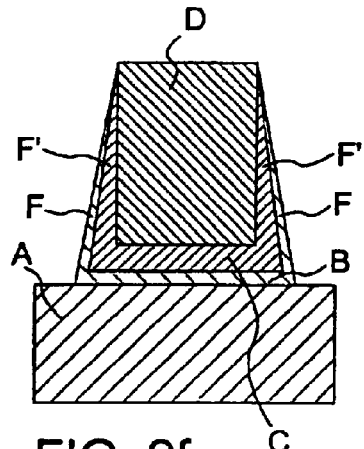
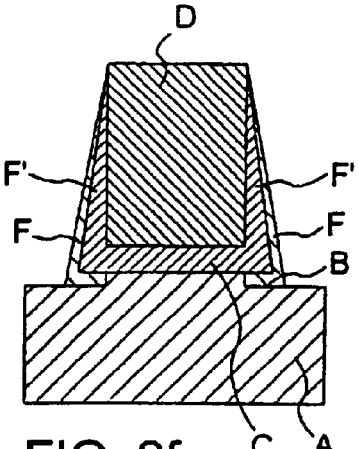
FIG. 1f    FIG. 2f    FIG. 3f

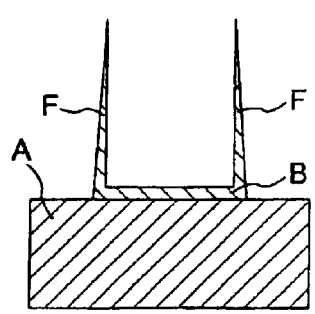
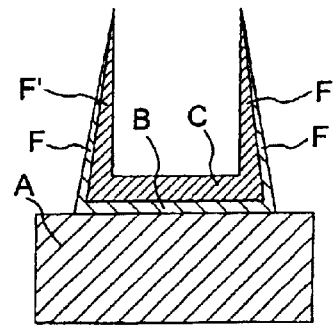
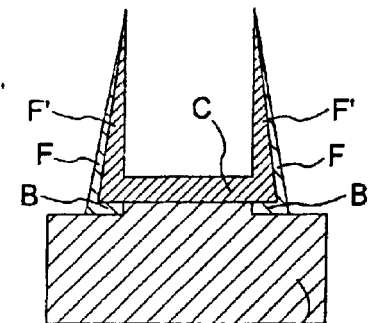
FIG. 1g  FIG. 2g  FIG. 3g
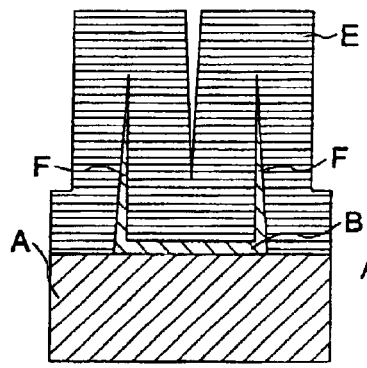
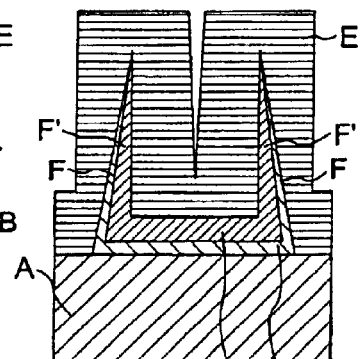
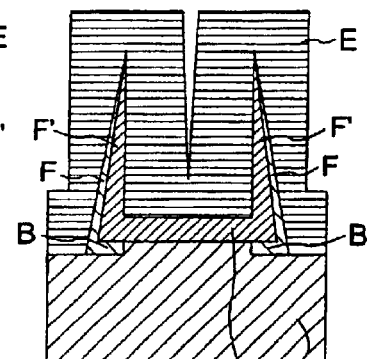
FIG. 1h  FIG. 2h  FIG. 3h
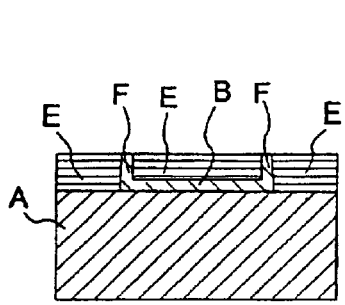
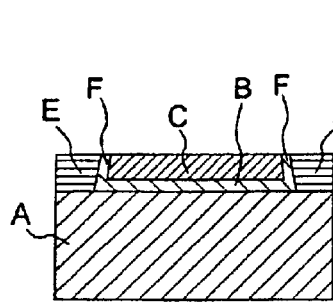
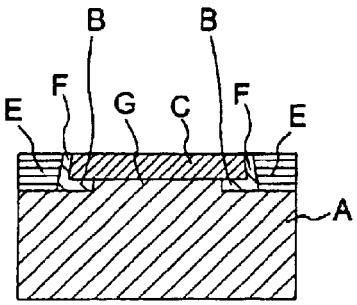
FIG. 1i  FIG. 2i  FIG. 3i

METHOD FOR PRODUCING A SEMICONDUCTOR STRUCTURE, AND USE OF THE METHOD

BACKGROUND OF THE INVENTION

Field of the Invention

The present invention relates to a method for producing a semiconductor structure, and to use of the method.

Manufacturers of semiconductor components, in particular, manufacturers of integrated circuits, are always interested in developing and using new methods for producing semiconductor structures for reasons related to cost, reasons associated with simplification of the manufacturing methods, reasons associated with progressive miniaturization of semiconductor structures, or reasons related to intellectual property.

Prior art methods are disclosed, for example, in European Patent Application 0 901 157 A2, in U.S. Pat. No. 5,885,900 to Schwartz and in U.S. Pat. No. 5,335,138 to Sandhu et al. Furthermore, the subject matter of German Published, Non-Prosecuted Patent Application 100 22 656.6, corresponding to U.S. Patent Publication 2002/019138 A1 to Gerhard et al., also deals with the production of semiconductor structures.

U.S. Pat. No. 6,037,206 to Huang et al. discloses a method for producing a capacitor for a dynamic random access memory, in which a first conductive layer is applied to an insulating layer, and a photoresist layer is applied to the first conductive layer. The latter leaves the first conductive layer partially exposed. The first conductive layer is etched to partially expose the insulating layer. In the process, fence-like plates are produced at the edges of the first conductive layer, and on the residues of the photoresist. The latter is then removed. A further conductive layer is then applied, which merges with the first conductive layer, with the fence-like plates and with the exposed surfaces of the insulating layer. In the process, sharp edges are created on the fence-like plates and on the further conductive layer, which are then rounded by etching.

U.S. Pat. No. 5,792,593 to McClure et al. discloses the etching of an initial material, in which this material rests on the side walls of a vertically running surface of a further material.

U.S. Pat. No. 6,210,595 B1 to Weinrich et al. and U.S. Pat. No. 5,938,250 to Onken also have similar disclosure contents.

SUMMARY OF THE INVENTION

It is accordingly an object of the invention to provide a method for producing a semiconductor structure, and use of the method that overcomes the hereinafore-mentioned disadvantages of the heretofore-known devices and methods of this general type and that provides a further, modern method for producing a semiconductor structure, as well as one possible use of this method.

With the foregoing and other objects in view, there is provided, in accordance with the invention, a method for producing a semiconductor structure, including the steps of applying a first layer to a substrate, applying a masking layer to the first layer, etching the first layer utilizing the masking layer as a mask to produce fences, removing the masking layer, applying an auxiliary layer to mechanically stabilize the fences, and subsequently removing the auxiliary layer and the fences except for a predetermined thickness of the auxiliary layer measured from a surface of the substrate.

In accordance with another mode of the invention, the etching step is carried out with an ion milling method.

In accordance with a further mode of the invention, at least one second layer is applied to the first layer before applying the masking layer, and the etching step is carried out by at least etching the second layer in addition to the first layer.

In accordance with an added mode of the invention, the auxiliary layer and the fences are removed by chemical-mechanical polishing.

In accordance with an additional mode of the invention, before application of the first layer, the substrate is treated to produce a local projection at the substrate.

In accordance with yet another mode of the invention, the first layer application step is carried out by applying a first layer to a substrate having a local projection.

In accordance with yet a further mode of the invention, a local projection is produced at the substrate before application of the first layer.

With the objects of the invention in view, there is also provided a method for producing a semiconductor structure, including the steps of applying a first layer to a surface of a substrate, applying a masking layer to the first layer, producing fences by etching the first layer and masking the first layer with the masking layer, removing the masking layer, mechanically stabilizing the fences by applying an auxiliary layer, and subsequently removing the auxiliary layer and the fences except for a predetermined thickness of the auxiliary layer measured from the substrate surface.

With the objects of the invention in view, there is also provided a method for producing spacers in a semiconductor structure, including the steps of applying a first layer to a substrate, applying a masking layer to the first layer, etching the first layer utilizing the masking layer as a mask to produce fences, removing the masking layer, applying an auxiliary layer to mechanically stabilize the fences, and producing spacers at the substrate by subsequently removing the auxiliary layer and the fences except for a predetermined thickness of the auxiliary layer measured from a surface of the substrate.

Other features that are considered as characteristic for the invention are set forth in the appended claims.

Although the invention is illustrated and described herein as embodied in a method for producing a semiconductor structure, and use of the method, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1A:
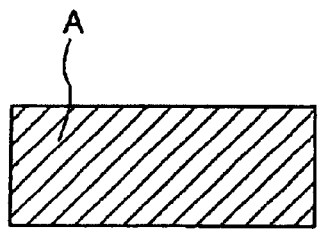
FIGS. 1 to 3 show three different embodiments of the production method.

The figures of the drawings are disposed parallel to one another to make it easier to compare the various embodiments with one another. Each of the figures is subdivided into figure elements, which are annotated with lower-case letters, such as a, b, c. These figure elements show individual process steps, with the same lower-case letters in the three figures indicating the same process steps. Because all the process steps that are illustrated overall in the drawing do not occur in each of the embodiments, individual process steps, and, hence, corresponding figure elements, are missing in some of the embodiments/figures.

Figure 1B:
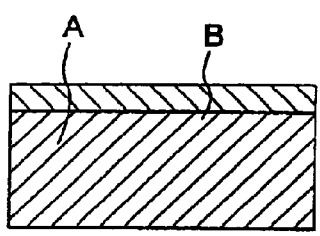
Figure 1C:
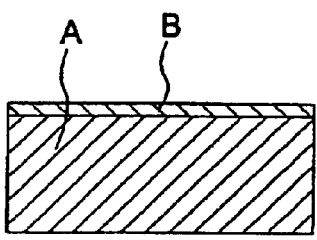

Referring now to the figures of the drawings in detail and first, particularly to FIG. 1 thereof, there is shown a first embodiment of the method according to the invention with its figure elements. A first layer B is deposited, or is applied in some other way, as shown in FIG. 1b, to a substrate A (illustrated in FIG. 1a; without departing from the present invention, this could be already be pretreated and/or structured in some way; furthermore, the substrate need not necessarily be a semiconductive base). This may be followed, using generally conventional methods, by etching back the first layer B to a predetermined extent (see FIG. 1c). A masking layer D (which, for example, may be photoresist or a so-called hard mask) is then applied to the first layer B, as illustrated in FIG. 1e, and the masking layer D is used as a mask in a subsequent etching process so that the first layer B is etched only in the area outside the masking layer D. During such an etching process, which is advantageously carried out as a so-called ion milling method, parts that are etched away from the first layer B rest as flanks F on the side walls of the masking layer D and, so to speak, clad the masking layer D. See FIG. 1f. The flanks F are normally referred to as fences. Fences F such as these are formed whenever the substances (etching substances) that are used for etching are not suitable for changing the layers to be removed during the etching process completely to the gaseous state. Etching methods such as these are generally referred to as ion milling methods. After removal of the masking layer D (see FIG. 1g), an auxiliary layer E is applied (for example, by deposition; see FIG. 1h) to the substrate A together with the remaining part of the first layer B and the fences F. The auxiliary layer E is composed, for example, of TEOS—SiO$_2$, and is used to stabilize the fences F at the side. Finally, the auxiliary layer E is removed together with the fences F except for a predetermined extent of the auxiliary layer E, as is illustrated in FIG. 1i. Chemical-mechanical polishing may advantageously carry out the removal process.

This, thus, results in a semiconductor structure having a substrate A, an auxiliary layer E, and a first layer B. The first layer B extends at its side edges together with the residues of the fences F upward, and, thus, clads that part of the auxiliary layer E that remains above the first layer B, at the side. The fences F, thus, act as spacers for the clad part of the auxiliary layer E.

The method according to the invention can, thus, advantageously be used to produce spacers in or for a semiconductor structure. Conventional methods for producing spacers are normally highly complex (inter alia, an anisotropic etching process is required, which is generally highly complex to carry out). Furthermore, the prior art methods allow the shape of the spacers to be influenced only to a very restricted extent. In contrast, the method according to the invention is relatively simple to carry out, and the shape of the fences that are used as spacers according to the invention can be determined very accurately.

Figure 2A:
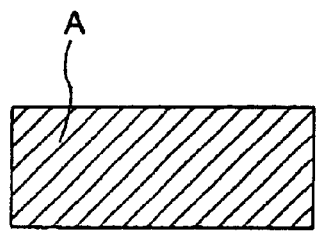
Figure 2B:
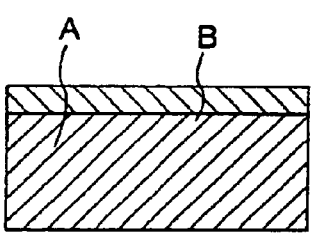
Figure 3B:
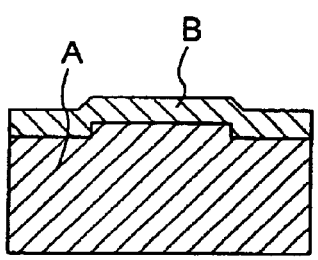
Figure 2C:
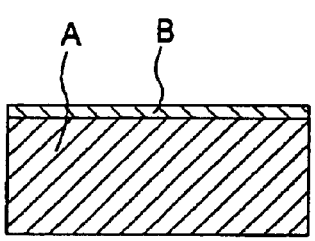

A second embodiment of the method according to the invention is illustrated in FIG. 2, with its figure elements. The method steps that are illustrated in the figure elements 2a to 2c are the same as those in the first embodiment. They will, therefore, not be explained once again here.

In the method step shown in FIG. 2d, on the other hand, a second layer C is also deposited onto the first layer B (and is possibly subsequently etched to a desired thickness, not illustrated in the figure). After application of the masking layer D (see FIG. 2e), the second layer C is now etched first of all, after which the first layer B is etched, preferably likewise by the ion milling method. The fences are, therefore, formed twice, namely firstly resulting from material from the second layer C (=fences F') and secondly resulting from material from the first layer B (=fences F). This can be seen in FIG. 2f. The rest of the method procedure is then as already described for the first embodiment. However, the finished semiconductor structure (see FIG. 2i) contains residues of the second layer C above the first layer B, as compared to the auxiliary layer E located in the corresponding area of the first embodiment (see FIG. 1i).

The described method steps may then be followed by further method steps both with regard to the subject matter of the first embodiment and with regard to the subject matter of the second embodiment, in particular, the deposition of further materials. In both cases, the process, then, allows layers located above the first layer B to be encapsulated, which is invariably desirable and may be deliberate; with regard to the subject matter of the first exemplary embodiment, this is a part of the auxiliary layer E while, in the case of the subject matter of the second exemplary embodiment (as in the case of the third exemplary embodiment as well, as described below), this is the second layer C.

Figure 3A:
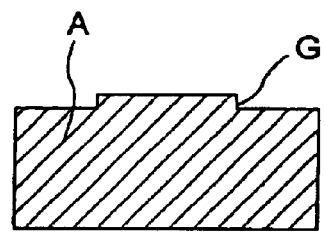
Figure 3C:
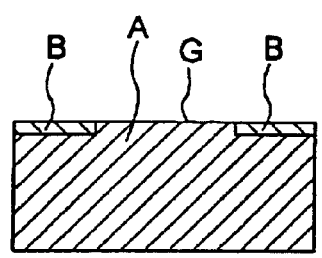

In the case of the third embodiment of the method according to the invention, the substrate A is treated before application of the first layer B such that a projection G is formed on it locally (see FIG. 3a). The first layer B is not applied until after the projection G has been made. The first layer B may, then, be removed (see FIG. 3c) until it is of equal thickness to the projection G, which leads to the first layer B not being distributed over the entire area on the substrate A. After application of the second layer C and of the masking layer D (which, as already mentioned, may, for example, be a photoresist or a so-called hard mask), as illustrated in FIGS. 3d and 3e, the first two layers B, C are etched once again using the masking layer D so that the fences F and F' are formed, in a corresponding way to that in the case of the second embodiment. After the fences F and F' are made (see FIGS. 3g to 3i), the process steps that are carried out are then the same as the corresponding process steps for the second embodiment, namely removal of the masking layer D, application of the auxiliary layer E and removal of the auxiliary layer E and fences F, F' until the (remaining) auxiliary layer E has a predetermined thickness.

In contrast to the semiconductor structure that was produced by the second embodiment of the method according to the invention and in which residues of the first layer B are located over the entire area between (residues of) the second layer C and the substrate A, at least the majority of the remaining part of the second layer C is in this case directly adjacent to the substrate A, to be precise, in the region of the projection G. Such a configuration may be used, for example, to place an electrical connection for the substrate A locally here.

In the implementation of the present invention, one having ordinary skill in the art would know that a number of different first and/or second layers can be provided and be processed in an appropriate manner, instead of an individual first and/or second layer (B, C). These layers may, likewise, also be composed of a noble metal or may contain noble metal.

We claim:

1. A method for producing a semiconductor structure, which comprises:
   applying a first layer to a substrate;
   applying a masking layer to the first layer;
   etching the first layer utilizing the masking layer as a mask to produce fences;
   removing the masking layer;
   applying an auxiliary layer to mechanically stabilize the fences; and
   subsequently removing the auxiliary layer and the fences except for a predetermined thickness of the auxiliary layer measured from a surface of the substrate.

2. The method according to claim 1, which further comprises carrying out the etching step with an ion milling method.

3. The method according to claim 1, which further comprises carrying out the etching step by ion milling.

4. The method according to claim 1, which further comprises
   applying at least one second layer to the first layer before applying the masking layer; and
   carrying out the etching step by at least etching the second layer in addition to the first layer.

5. The method according to claim 1, which further comprises removing the auxiliary layer and the fences by chemical-mechanical polishing.

6. The method according to claim 1, which further comprises, before application of the first layer, treating the substrate to produce a local projection at the substrate.

7. The method according to claim 1, which further comprises carrying out the first layer application step by applying a first layer to a substrate having a local projection.

8. The method according to claim 1, which further comprises producing a local projection at the substrate before application of the first layer.

9. The method according to claim 1, which further comprises forming the first layer of a noble metal.

10. A method for producing a semiconductor structure, which comprises:
    applying a first layer to a surface of a substrate;
    applying a masking layer to the first layer;
    producing fences by etching the first layer and masking the first layer with the masking layer;
    removing the masking layer;
    mechanically stabilizing the fences by applying an auxiliary layer; and
    subsequently removing the auxiliary layer and the fences except for a predetermined thickness of the auxiliary layer measured from the substrate surface.

11. A method for producing spacers in a semiconductor structure, which comprises:
    applying a first layer to a substrate;
    applying a masking layer to the first layer;
    etching the first layer utilizing the masking layer as a mask to produce fences;
    removing the masking layer;
    applying an auxiliary layer to mechanically stabilize the fences; and
    producing spacers at the substrate by subsequently removing the auxiliary layer and the fences except for a predetermined thickness of the auxiliary layer measured from a surface of the substrate.

12. The method according to claim 11, which further comprises forming the first layer of a noble metal.

* * * * *